US008289267B2

(12) United States Patent
Park et al.

(10) Patent No.: US 8,289,267 B2
(45) Date of Patent: Oct. 16, 2012

(54) BACKLIGHT ASSEMBLY AND DISPLAY APPARATUS HAVING THE SAME

(75) Inventors: Sang-Il Park, Seoul (KR); Gi-Cherl Kim, Yongin-si (KR); Se-Ki Park, Suwon-si (KR); Si-Joon Song, Suwon-si (KR); Moon-Hwan Chang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 552 days.

(21) Appl. No.: 12/419,359

(22) Filed: Apr. 7, 2009

(65) Prior Publication Data
US 2009/0309498 A1    Dec. 17, 2009

(30) Foreign Application Priority Data
Jun. 13, 2008 (KR) .................. 10-2008-0055768

(51) Int. Cl.
*G09G 3/14* (2006.01)
(52) U.S. Cl. .................. 345/102; 345/214; 362/97.3
(58) Field of Classification Search .................. 362/97.3; 349/68; 345/102
See application file for complete search history.

(56) References Cited

U.S. PATENT DOCUMENTS

| 7,946,723 B2 * | 5/2011 | Oku et al. .................. 362/97.3 |
| 2003/0223218 A1 * | 12/2003 | Kawakami .................. 362/31 |
| 2006/0092346 A1 * | 5/2006 | Moon et al. .................. 349/61 |
| 2007/0132707 A1 * | 6/2007 | Choi et al. .................. 345/102 |
| 2007/0182885 A1 * | 8/2007 | Egi et al. .................. 349/96 |
| 2008/0002102 A1 * | 1/2008 | Lee .................. 349/68 |
| 2008/0002103 A1 * | 1/2008 | Lee .................. 349/68 |

FOREIGN PATENT DOCUMENTS

| KR | 200151018 Y1 | 7/1999 |
| KR | 1020050077425 A | 8/2005 |
| KR | 1020060081917 A | 7/2006 |
| WO | WO2006/051683 | * 5/2006 |

* cited by examiner

*Primary Examiner* — Jacob Y Choi
*Assistant Examiner* — Anthony Arpin
(74) *Attorney, Agent, or Firm* — Cantor Colburn LLP

(57) ABSTRACT

A backlight assembly includes a main circuit board having a light-generating part, a control circuit board which provides a control signal for controlling the light-generating part, and a sub-circuit board which is electrically connected to the control circuit board and receives the control signal, the sub-circuit board including a buffer which generates an amplified control signal in response to the control signal, and where the sub-circuit board is electrically connected to the main circuit board and provides the amplified control signal. The control circuit board and the main circuit board are electrically connected by the sub-circuit board, and the sub-circuit board amplifies the control signal received from the control circuit board and provides the control signal to the main circuit board.

20 Claims, 8 Drawing Sheets

BACKLIGHT ASSEMBLY AND DISPLAY APPARATUS HAVING THE SAME

This application claims priority to Korean Patent Application No. 2008-55768, filed on Jun. 13, 2008, and all the benefits accruing therefrom under 35 U.S.C. §119, the contents of which in its entirety are herein incorporated by reference.

BACKGROUND OF THE INVENTION

1. Field of the Invention

This disclosure relates to a backlight assembly and a display apparatus having the same.

2. Description of the Related Art

A liquid crystal display ("LCD") apparatus includes an LCD panel which displays an image, a backlight assembly which provides light to the LCD panel, and a driving unit which drives the LCD panel.

The backlight assembly may include a light source for generating light. Exemplary light sources include a cold cathode fluorescent lamp ("CCFL"), a hot cathode fluorescent lamp ("HCFL"), or a light-emitting diode ("LED"). LEDs are used commercially as a light source for LCDs because LEDs have low power consumption and high color reproducibility.

A recently developed backlight assembly includes a light-generating board which includes LEDs, a container containing the light-generating board, and a light-driving board connected to and controlling the light-generating board.

As the number of the LEDs increases, or the number of signals provided to the LEDs increases, the number of signal lines formed in the light-driving board and the light-generating board increases concomitantly. As the number of signal lines increases, electrically connecting the signal lines of the light-driving board and those of the light-generating board may be difficult. Moreover, signal line connections may be prone to disconnection, or a large number of signal lines may have a disorderly appearance.

BRIEF SUMMARY OF THE INVENTION

Embodiments of the disclosure provide a backlight assembly having optimized connections and electrical stability.

Embodiments of the disclosure also provide a display apparatus having the same.

According to one aspect of the disclosure, there is provided a backlight assembly. The backlight assembly includes a main circuit board, a control circuit board and a sub-circuit board.

The main circuit includes a light-generating part. The control circuit board provides a control signal which controls the light-generating part. The sub-circuit board is electrically connected to the control circuit board and receives the control signal, the sub-circuit board including a buffer which generates an amplified control signal in response to the control signal, and wherein the sub-circuit board is connected to the main circuit board and provides the amplified control signal.

The backlight assembly may further include a power circuit board having a power-generating part providing a first power signal to the sub-circuit board, the power circuit board connected to the sub-circuit board.

The sub-circuit board may further include a regulator electrically connected to the power circuit board and receiving the first power signal. The regulator may transform the first power signal to a second power signal, and the second power signal may be provided to the buffer. The buffer may generate an amplified power signal corresponding to the second power signal received by the regulator.

According to one aspect, there is provided a display apparatus. The display apparatus includes a display panel which displays an image using light; and a backlight assembly disposed under the display panel which provides the light to the display panel.

The backlight assembly includes a main circuit board, a control circuit board and a sub-circuit board. The main circuit includes a light-generating part. The control circuit board provides a control signal which controls the light-generating part. The sub-circuit board is connected to the control circuit board and receives the control signal, the sub-circuit board including a buffer which generates an amplified control signal in response to the control signal, and wherein the sub-circuit board is connected to the main circuit board and provides the amplified control signal.

According to the embodiments of the disclosure, a control circuit board and a main circuit board are connected by a sub-circuit board, and the sub-circuit board amplifies a control signal received from the control circuit board and outputs the control signal to the main circuit board. Thus, the number of signal lines in the control circuit board, which is electrically connected to the main circuit board, may be decreased and loads in the control circuit board may be decreased, and thus the control circuit board may be electrically stable.

BRIEF DESCRIPTION OF THE DRAWINGS

The disclosed subject matter is particularly pointed out and distinctly claimed in the claims at the conclusion of the specification. The above and other features and advantages of the disclosed embodiments are apparent from the following detailed description when considered in conjunction with the accompanying drawings wherein:

DETAILED DESCRIPTION OF THE INVENTION

Figure 1:
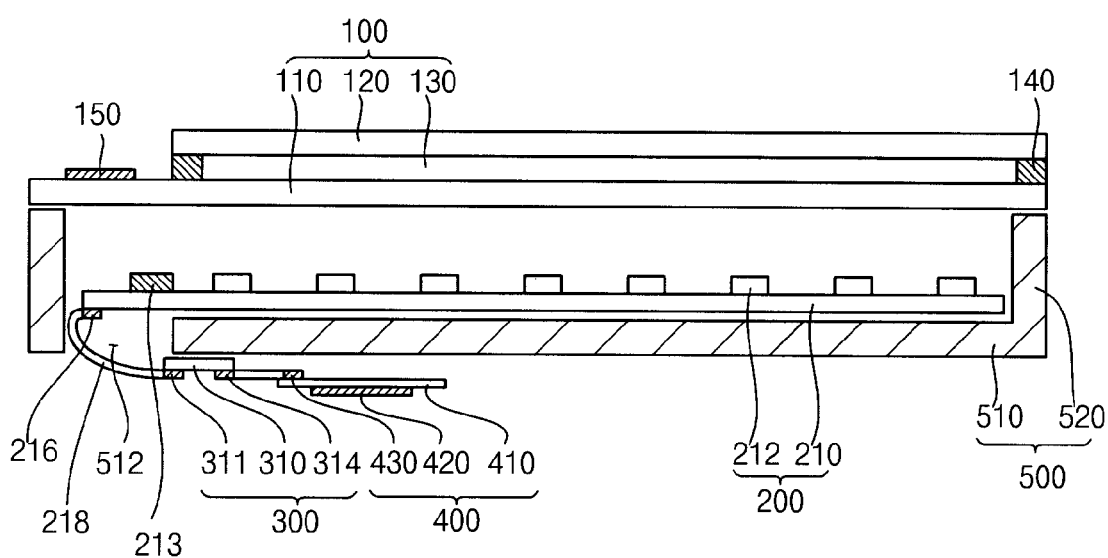
FIG. 1 is a cross-sectional view showing an exemplary embodiment of a display apparatus in accordance with Embodiment 1.

Hereinafter, various embodiments of a backlight assembly, and a display apparatus having the same, will be fully described with reference to the figures.

The embodiments are described more fully hereinafter with reference to the accompanying drawings, in which embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The device may be otherwise oriented (rotated 90 degrees or at other orientations) and the spatially relative descriptors used herein interpreted accordingly.

The terminology used herein is for the purpose of describing particular embodiments only and is not intended to limit the scope of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view showing an exemplary embodiment of a display apparatus in accordance with Embodiment 1.

Figure 2:
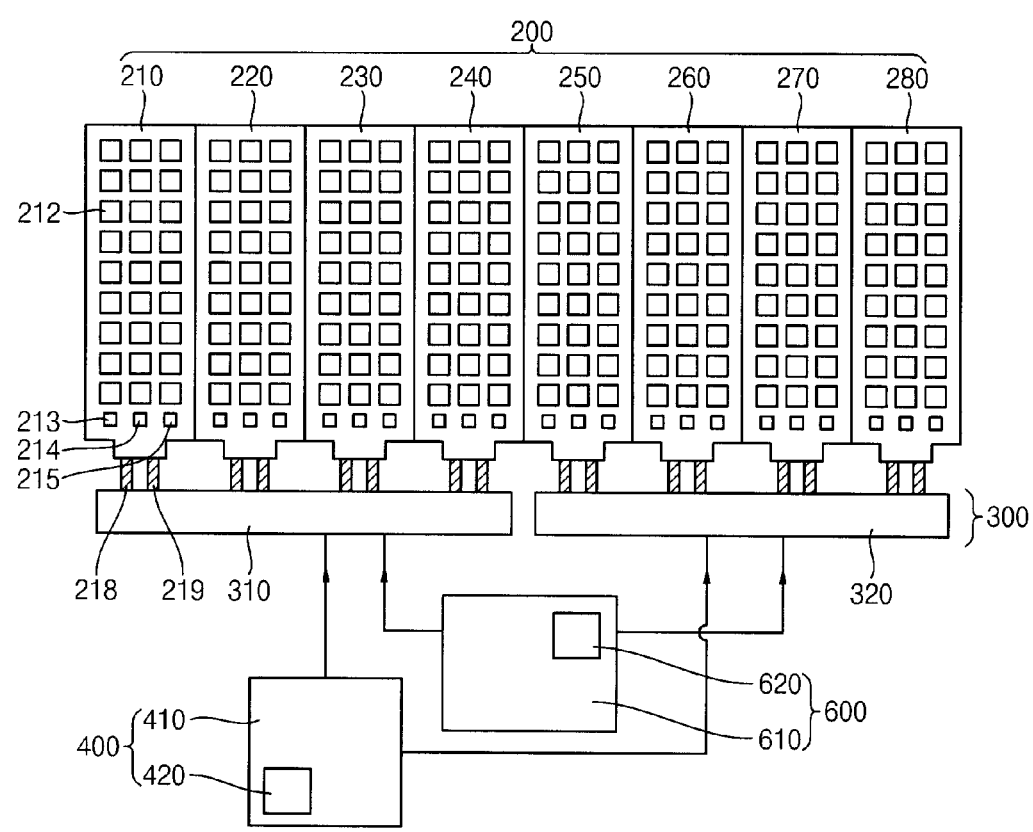
FIG. 2 is a plan view showing an exemplary embodiment of the backlight assembly shown in FIG. 1.
Figure 3:
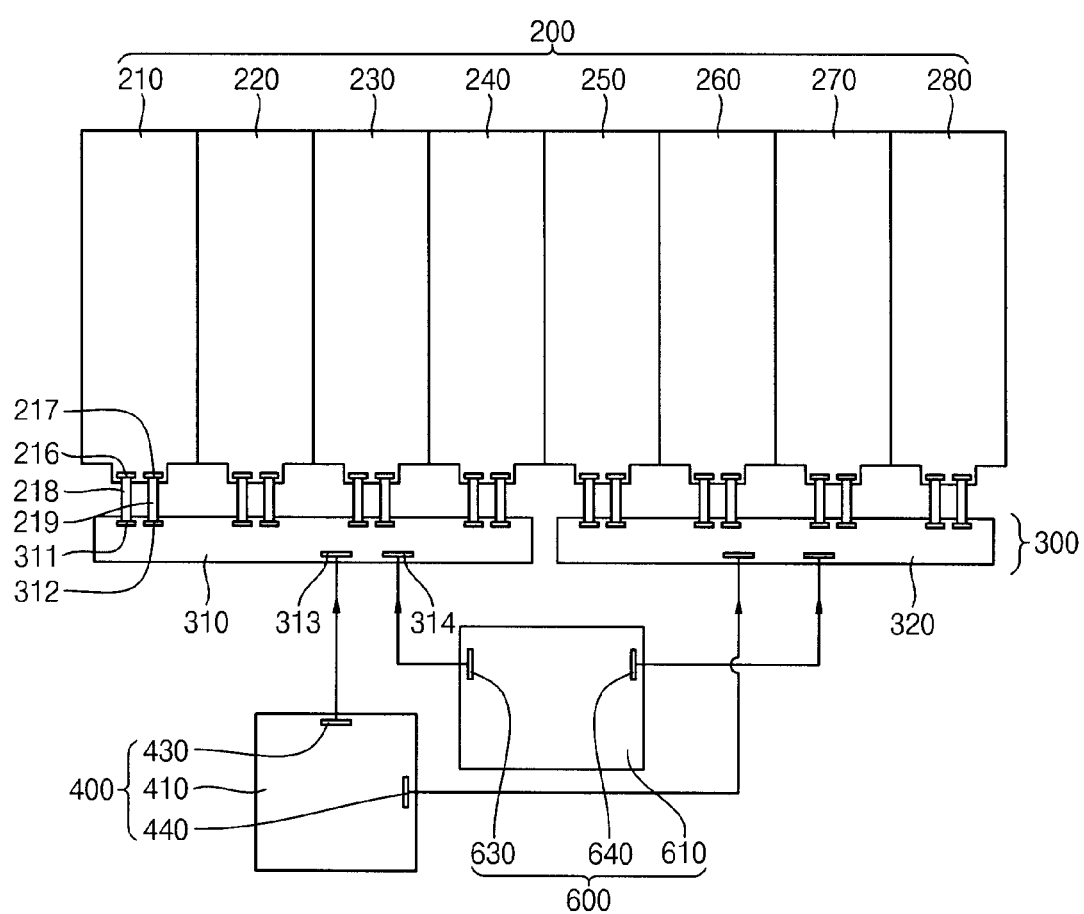
FIG. 3 is a rear view showing an exemplary embodiment of the backlight assembly shown in FIG. 2.

FIG. 2 is a plan view showing an exemplary embodiment of a backlight assembly shown in FIG. 1, and FIG. 3 is a rear view showing an exemplary embodiment of the backlight assembly shown in FIG. 2.

Referring to FIGS. 1, 2 and 3, a display apparatus in accordance with Embodiment 1 includes a display panel 100 which displays an image using light and a backlight assembly.

The display panel 100 may display an image using the light provided from the backlight assembly. The display panel 100 includes a first substrate 110, a second substrate 120, and a liquid crystal layer 130. The first substrate 110 may include a panel driving chip 150 which drives the display panel 100. The first substrate 110 and the second substrate 120 may be adhered to each other by a sealant 140.

The first substrate 110 may include a gate line (not shown), a data line (not shown) crossing the gate line, a thin-film transistor ("TFT", not shown) electrically connecting to the gate line and the data line, and a pixel electrode electrically connected to each TFT. The second substrate 120 may include a color filter (not shown) disposed on a region corresponding to the pixel electrodes and a common electrode. The liquid crystal layer 130 may be disposed between the first substrate 110 and the second substrate 120. An image is displayed on the display panel 100 according to the light transmittance of a liquid crystal material, which changes transmittance according to a voltage. In one embodiment, the first substrate 110 may include a color filter (not shown) disposed under the pixel electrode, and the second substrate 120 may not include the color filter.

The backlight assembly can comprise a light generating part 200, which includes a main circuit board, a buffer unit, which includes a sub-circuit board, a control unit, a power supply, and a container. In an exemplary embodiment, the backlight assembly includes a light-generating part 200 which comprises a plurality of main circuit boards 210, 220, 230, 240, 250, 260, 270 and 280, a buffer unit 300 which includes a plurality of sub-circuit boards 310 and 320, a control unit 400, a power supply unit 600, and a container 500. The light-generating unit 200 can include a plurality of the main circuit boards 210, 220, 230, 240, 250, 260, 270 and 280, and include a light-generating part. The light-generating part 200 may be disposed under the display panel 100.

A plurality of the main circuit boards 210, 220, 230, 240, 250, 260, 270 and 280 may be arranged parallel with each other. For example, the light-generating part 200 may include eight main circuit boards 210, 220, 230, 240, 250, 260, 270 and 280.

The light-generating part 200 can include the eight main circuit boards 210, 220, 230, 240, 250, 260, 270, and 280 in Embodiment 1. In an embodiment, the light-generating part 200 may include one, or more than one, main circuit board, depending on an area of the display panel 100, the desired brightness, or the like.

The light-generating part includes a plurality of light sources 212 providing the light to the display panel 100. The light sources 212 may be disposed on each of the main circuit boards 210, 220, 230, 240, 250, 260, 270 and 280, and each of the main circuit boards 210, 220, 230, 240, 250, 260, 270 and 280 may include a plurality of the light sources 212.

The light sources 212 may include a light-emitting diode ("LED"). In one embodiment, the light sources 212 may include a first color LED, a second color LED and a third color LED. Each of the first color LED, the second color LED, and the third color LED may have a different color. For example, the first color LED may be a red LED, the second color LED may be a green LED, and the third color LED may be a blue LED. In an embodiment, the light sources 212 may be a white LED.

The light-generating part may further include a light driving chip, such as the light-driving chips 213, 214 and 215.

The light-driving chip, such as light driving chips 213, 214 and 215, may be disposed on one face of each of the main circuit boards 210, 220, 230, 240, 250, 260, 270, and 280, and the main circuit boards may include the light sources 212. Thus the light-driving chips may include a first light-driving chip 213, a second light-driving chip 214, and a third driving chip 215. In one embodiment, the first light-driving chip 213 may be a light-driving chip driving the first color LED, the second light-driving chip 214 may be a light-driving chip driving the second color LED, and the third light-driving chip 215 may be a light-driving chip driving the third color LED. In an embodiment, the first, the second, and the third driving chips 213, 214 and 215 may drive a plurality of the white LEDs.

Each of the main circuit boards 210, 220, 230, 240, 250, 260, 270 and 280 includes three light-driving chips 213, 214 and 215 in Embodiment 1, but each of the main circuit boards 210, 220, 230, 240, 250, 260, 270 and 280 may include two, four, or more than four light-driving chips, depending on a method of driving the light-generating part, or the type of color LED, for example.

The light-generating part 200 may further include a first connector 216 and a second connector 217. The main circuit boards 210, 220, 230, 240, 250, 260, 270 and 280, and the buffer unit 300, may be electrically connected by the first connector 216 and the second connector 217. Each of the main circuit boards 210, 220, 230, 240, 250, 260, 270 and 280 may include the first connector 216 and the second connector 217. The first connector 216 and the second connector 217 may each be disposed on a different face of each of the main circuit boards 210, 220, 230, 240, 250, 260, 270 and 280. The face may be a face opposing the face which includes one of the light-driving chips 213, 214 and 215. The first connector 216 may divide a signal received from the buffer unit 300 to provide a plurality of divided signals, and output each of the divided signals to the first, the second, and the third light-driving chips 213, 214 and 215. The first connector 216 may provide the rest of the signal received from the buffer unit 300 to each of the light-driving chips 213, 214 and 215. The signal received from the buffer unit 300 may include a signal generated in the control unit 400 and/or a signal generated in the buffer unit 300.

The second connector 217 may provide a signal received from the buffer unit 300 unchanged to each of the light-driving chips 213, 214 and 215.

The first connector 216 may be electrically connected to an edge portion of a first connecting member 218, and the second connector 217 may be electrically connected to an edge portion of a second connecting member 219. An opposite edge portion in each of the first connecting member 218 and an opposite edge portion of the second connecting member 219 may be electrically connected to the buffer unit 300. Each of the first and the second connecting members 218 and 219 may be a cable which includes a plurality of signal lines.

The buffer unit 300 may electrically and physically connect the light generating part 200 to the control unit 400 and the power supply unit 600. The buffer unit 300 may include a sub-circuit board, such as a first sub-circuit board 310 and a second sub-circuit board 320.

Figure 4:
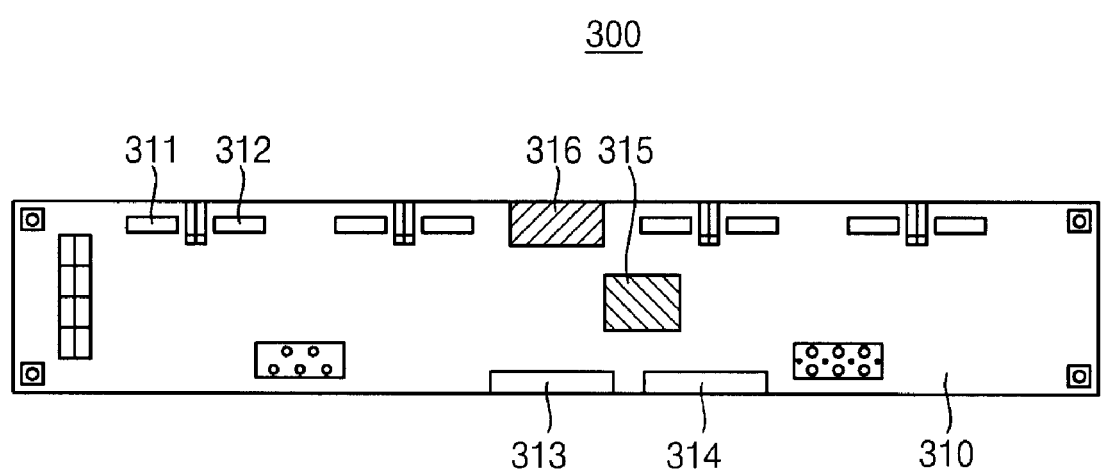
FIG. 4 is a plan view showing an exemplary embodiment of the buffer unit shown in FIG. 2.

Each of the first sub-circuit board 310 and the second circuit board 320 may be include a buffer circuit which includes a signal line which receives a signal generated in the control unit 400, a buffer 316 (as is shown in FIG. 4) amplifying a part of the signal generated in the control unit 400, and a regulator 315 (as is shown in FIG. 4).

The buffer circuit may generate a signal which is provided to the first, the second, and the third light-driving chips 213, 214 and 215, and the buffer circuit part may provide the signal provided to the first, the second, and the third light-driving chips 213, 214 and 215, to the light-generating part 200. For example, the buffer circuit may generate the signal provided to the first, the second, and the third light-driving chips 213, 214 and 215 using a signal received from the power supply unit 600.

The first sub-circuit board 310 may be electrically connected to one or more of the main circuit boards. In an embodiment, the first sub-circuit board 310 may be electrically connected to the four main circuit boards 210, 220, 230 and 240. The first sub-circuit board 310 may be electrically connected to the control unit 400 and the power supply unit 600.

The second sub-circuit board 320 may be physically separated from the first sub-circuit board 310. The second sub-circuit board 320 may be electrically connected to one or more of the main circuit boards. The second sub-circuit board may be electrically connected to the remaining main circuit boards which the first sub-circuit board is not electrically connected to. In an embodiment, the second sub-circuit board 320 may be electrically connected to the four circuit boards 250, 260, 270 and 280 and, wherein the four main circuit boards 210, 220, 230 and 240 are connected to the first sub-circuit board 310. The second sub-circuit board 320 may be connected to the control unit 400 and the power supply unit 600.

The buffer unit 300 includes the first sub-circuit board 310 and the second sub-circuit board 320 in Embodiment 1, and the buffer unit 300 may include one or more than one sub-circuit boards in an embodiment.

Each of the first sub-circuit board 310 and the second circuit board 320 may include a data output connector 311, a power output connector 312, a data input connector 313, and a power input connector 314.

The data output connector 311 may be electrically connected to an opposite portion of the first connecting member 218, the first connecting member 218 electrically connected to the first connector 216, and the power output connector 312 may be electrically connected to an opposite portion of the second connecting member 219, which is electrically connected to the second connector 217. Thus, the buffer unit 300 may be electrically connected to the light-generating part 200. The data output connector 311 and the power output connector 312 may be disposed at an edge portion of the sub-circuit board, such as the first sub-circuit board 310 or the second sub-circuit board 320.

The data input connector 313 is electrically connected to the control unit 400, and the power input connector 314 is electrically connected to the power supply unit 600. The data input connector 313 and the power input connector 314 may be adjacently disposed at an opposite edge portion of the sub-circuit board, such as the first sub-circuit board 310 or the second sub-circuit board 320.

The control unit 400 may include a control circuit board 410 connected to the buffer unit 300, and data output connectors 430 and 440 respectively connected to the first sub-circuit board 310 and the second sub-circuit board 320. The control circuit board 410 may include a control circuit which comprises a control driving chip 420, the control driving chip 420 generating a control signal which controls the light source 212, and the data signal which drives the first, the second, and the third light-driving chips 213, 214 and 215. For example, the control signal may include a serial clock ("SCL") signal. The control signal may further include a chip select ("CS") signal which selects a light-driving chip, such as the first, the second, or the third light-driving chip 213, 214 or 215. The CS signal may be generated in the buffer unit 300. For example, the data signal can include a dimming signal ("DMS") controlling brightness, as desired depending on an image signal, a vertical sync ("Vsync") signal, a horizontal sync ("Hsync") signal, or the like, or a combination comprising at least one of the foregoing signals. The control unit 400 may generate the control signal and the data signal and provide the control signal and the data signal to the buffer unit 300. The data signal may be generated by the control driving chip 420 and be provided to the light-generating part 200 unchanged through the buffer unit 300. The control signal may be amplified in the buffer unit 300 and then be provided to the light-generating part 200.

The power supply unit 600 includes a power circuit board 610 which includes a power-generating part which generates a driving power signal. The power circuit board 610 is electrically connected to the buffer unit 300. The power supply unit 600 may provide the driving power signal to the light-generating part 200 through the buffer unit 300. The power-generating part may include a power driving chip 620. In an exemplary embodiment, the driving power signal may have a voltage level between about 1 volt to about 250 volts, specifically 6 volts to about 115 volts, more specifically about 24 volts. The power supply unit 600 may further include a power output connectors 630 and 640 respectively connected to the first sub-circuit board 310 and the second sub-circuit board 320.

Moreover, the power-generating part generates a first power signal which has a different voltage level from that of the driving power signal and provides the first power signal to the buffer unit 300. For example, the first power signal may have a voltage level between about 1 volt to about 250 volts, specifically 6 volts to about 115 volts, more specifically about 5 volts. The first power signal may be transformed into a second power signal having a different voltage level from that of the first power signal in the buffer unit 300 and be provided to the light-generating part 200. The power supply unit 600 provides ground voltage to the buffer unit 300. The ground voltage may include a digital ground voltage ("GND") provided to the data output connector 311, and an analog ground voltage ("GNA") provided to the power output connector 312.

The container 500 includes a bottom face 510 and a sidewall 520 connected to the bottom face 510. The bottom face 510 and the sidewall 520 define a receiving space of the container 500. The main circuit boards 210, 220, 230, 240, 250, 260, 270 and 280 are disposed on the bottom face 510. The bottom face 510 includes a first opening 512. The first connecting member 218 is disposed in of the receiving space, and then bends to a rear face of the bottom face 510. The first sub-circuit board 310, the second sub-circuit board 320, and the control circuit board 410 are disposed on the rear face of the bottom face 510. The first sub-circuit board 310, the second sub-circuit board 320, and the control circuit board 410 may be disposed on the rear face by soldering, brazing, or the like, or a combination comprising at least one of the foregoing fixing methods.

Although not shown in figures, the display apparatus in accordance with Embodiment 1 may further include an optical member disposed between the display panel 100 and the main circuit boards 210, 220, 230, 240, 250, 260, 270 and 280. For example, the optical member may include a diffusion plate, a prism sheet, a diffusion sheet, a brightness enhancement sheet, or the like.

Hereinafter, the buffer unit will be described with reference to FIG. 4.

FIG. 4 is a plan view illustrating an exemplary embodiment of the buffer unit shown in FIG. 2.

Referring to FIG. 4, the first sub-circuit board 310 of the buffer unit 300 includes the data input connector 313, the power input connector 314, the regulator 315, the buffer 316, the data output connector 311, and the power output connector 312.

The data input connector 313 receives the dimming signal (DMS), the vertical sync signal (Vsync), the horizontal sync signal (Hsync), the serial clock signal (SCL), or the like, or a combination comprising at least one of the foregoing signals from the control circuit of the control unit 400. The data output connector 311 of the first sub-circuit board 310 provides the dimming signal (DMS), the vertical sync signal (Vsync), and the horizontal sync signal (Hsync) to the main circuit boards 210, 220, 230, 240, 250, 260, 270 and 280. The serial clock signal (SCL) is provided to the buffer 316.

The power input connector 314 receives the driving power signal, the ground voltage, the first power signal, or the like from the power supply unit 600. The driving power signal is provided through the power output connector 312 in the first sub-circuit board 310. Each ground voltage is provided through the data output connector 311 and the power output connector 312 in the first sub-circuit board 310. The first power signal is provided to the regulator 315.

The regulator 315 transforms the first power signal to the second power signal. When the first, the second, and the third light-driving chips 213, 214 and 215 are driven by an Inter-IC bus ("I²C") process, the regulator 315 may generate the chip select signal (CS) using the second power signal. The regulator 315 can provides the second power signal to the buffer 316. The chip select signal (CS) generated by the regulator 315 may be provided to the buffer 316.

A circuit board generating the second power signal and the signal line transmitting the second power signal may be omitted because the second power signal is generated in the first sub-circuit board 310. In particular, loads in the data input connector 313 may be decreased because the second power signal is generated by using the first power signal received from the power input connector 314, instead of being received from the data input connector 313.

The buffer 316 receives the second power signal, the chip select signal (CS), and the serial clock signal (SCL). The buffer 316 generates an amplified power signal, an amplified select signal, and an amplified clock signal by amplifying the second power signal, the chip select signal (CS), and the serial clock signal (SCL), and then buffers and provides the amplified power signal, the amplified select signal, and the amplified clock signal. Each of the amplified power signal, the amplified select signal, and the amplified clock signal can have a voltage which is the same as a voltage level of the second power signal, the chip select signal (CS), and the serial clock signal (SCL), and has a current which is greater than a current of the second power signal, the chip select signal (CS), and the serial clock signal (SCL). The amplified power signal, the amplified select signal, and the amplified clock signal are provided to the light-generating part 200 through the data output connector 311.

In an embodiment, the second power signal, the chip select signal (CS), and the serial clock signal (SCL) are provided to each of the main circuit boards, such as the main circuit boards 210, 220, 230, 240, 250, 260, 270 and 280, for example. The second power signal, the chip select signal (CS), and the serial clock signal (SCL) are provided to the first, the second and the third light-driving chips 213, 214 and 215 in each of the main circuit boards 210, 220, 230, 240, 250, 260, 270 and 280.

The amplified power signal, the amplified select signal, and the amplified clock signal generated in the buffer 316 are provided to the light-generating part 200 and are divided, and then a divided amplified power signal, a divided amplified select signal, and a divided amplified clock signal are provided to the first, the second, and the third light-driving chips 213, 214 and 215. Thus, the control circuit may generate the second power signal and the serial clock signal, the number of the second power signals and the number of the serial clock signals being the same as the number of the main circuit boards, and then the regulator 315 or the control circuit may generate the chip select signal, the number of the chip select signals being the same as the number of the main circuit boards. The buffer unit 300 transmits the second power signal, the chip select signal, and the serial clock signal to the light-generating part 200. The number of the second power signals, the number of the chip select signals, and the number of the serial clock signals is the same as the number of the main circuit boards. The second power signal, the serial clock signal (SCL), and the chip select signal (CS) are integrated in the buffer unit 300, and thus the number of signal lines in the control circuit board 410 may be decreased.

The data output connector 311 transmits the dimming signal (DMS), the vertical sync signal (Vsync), the horizontal sync signal (Hsync), the amplified power signal, the amplified select signal, the amplified clock signal, and the digital ground voltage (GND).

The power output connector 312 transmits the driving power signal and the analog ground voltage (GNA).

A structure, electrically connecting the second circuit board 320, is substantially the same as that described in conjunction with the first sub-circuit board 310 in the buffer unit 300. Thus, any further description will be omitted.

Hereinafter, the connectivity of the main circuit board, the first sub-circuit board, and the control circuit board will be described with reference to FIG. 5.

Figure 5:
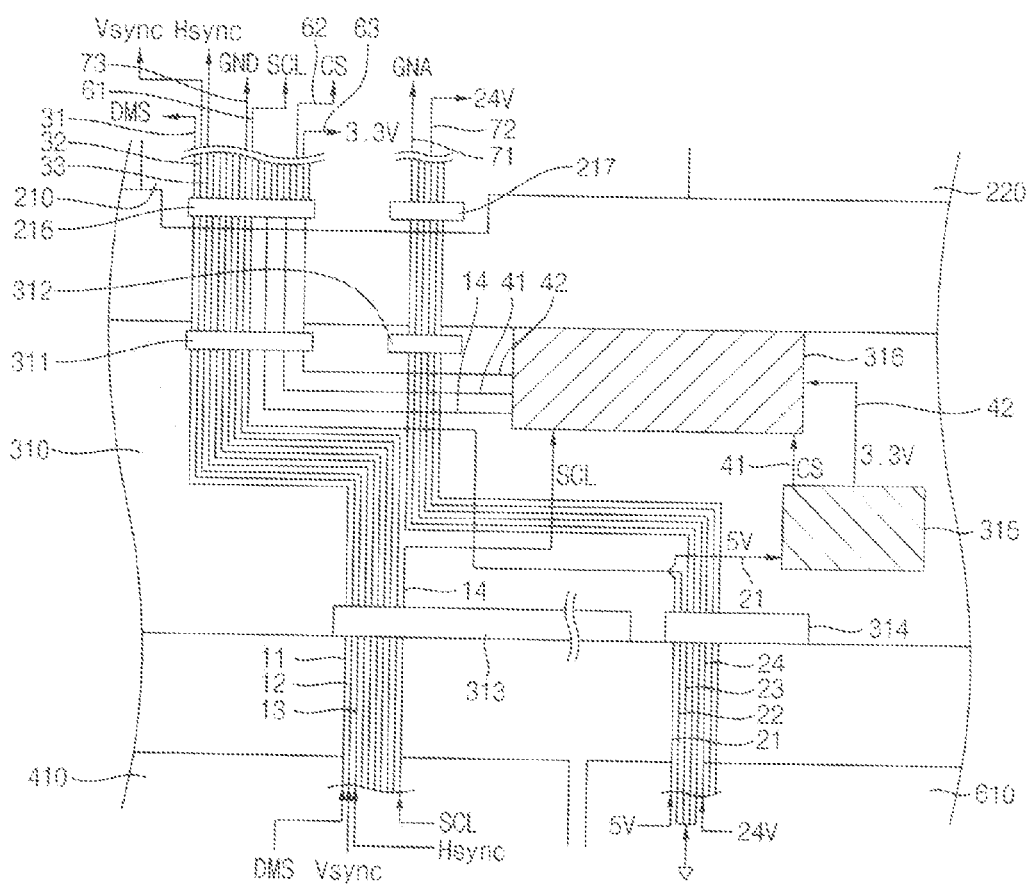
FIG. 5 is a schematic circuit view showing an exemplary embodiment of the backlight assembly shown in FIG. 2.

FIG. 5 is a schematic circuit view showing an exemplary embodiment of the backlight assembly shown in FIG. 2.

First, the connectivity of the control circuit board 410 of the control unit 400, the first sub-circuit board 310 of the buffer unit 300, and one main circuit board 210 of the main circuit boards 210, 220, 230, 240, 250, 260, 270 and 280 will be described.

Referring to FIG. 5, the control circuit board 410 includes a plurality of signal lines which transmit signals generated in the control driving chip 420 to the main circuit board 210. The plurality of signal lines may include a dimming signal line 11 transmitting the dimming signal (DMS), a vertical sync signal lines 12 transmitting the vertical sync signal, a horizontal sync signal lines 13 transmitting the horizontal sync signal, and a clock signal line 14 transmitting the serial clock signal.

The number of the dimming signal lines 11, the number of the vertical sync signal lines 12, and the number of the horizontal sync signal lines 13, are the same as the number of the light-driving chips, the dimming signal line 11, the vertical sync signal line 12, and the horizontal sync signal line 13 being electrically connected to the main circuit board 210 and disposed on the control circuit board 410. In other words, where n represents the number of the light-driving chips included in the one main circuit board 210, n is an integer which is equal to or greater than 2, and the control circuit board 410 may include n dimming signal lines 11, n vertical sync signal lines 12 and n horizontal sync signal lines 13.

In one embodiment, the main circuit board 410 includes three dimming signal lines 11, three vertical sync signal lines 12, and three horizontal sync signal lines 13, because the main circuit board 210 includes the first, the second, and the third light-driving chips 213, 214 and 215.

The data input connector 313 includes first input terminals (not shown) and first output terminals (not shown) which correspond to the first input terminals, and provides a signal received from the first input terminal to a signal line of the first sub-circuit board 310.

The first input terminals are electrically connected to the dimming signal line 11, the vertical sync signal line 12, the horizontal sync line 13, and the clock signal line 14 of the main circuit board 410. The first output terminal transmits the dimming signal (DMS), the vertical sync signal (Vsync), the horizontal sync signal (Hsync), and the serial clock signal (SCL). The data input connector 313 may include ten first input terminals and ten output terminals, which are connected to the main circuit board 210.

The dimming signal line 11, the vertical sync signal line 12, the horizontal sync line 13, and the clock signal line 14, which are connected to the data input connector 313, extend to an opposite edge portion of the first sub-circuit board 310, and are electrically connected to the data output connector 311.

The dimming signal line 11, the vertical sync signal line 12, the horizontal sync line 13, and the clock signal line 14, which are connected to the data output connector 311, extend to the first connecting member 218, and are electrically connected to the first connector 216. Thus, the dimming signal line 11, the vertical sync signal line 12, the horizontal sync line 13, and the clock signal line 14, which are connected to the first connector 216, are connected to the three first signal lines 31, three second signal lines 32 and three third signal lines 33. Each of the first signal lines 31 is connected to each of the dimming signal lines 11, each of the second signal lines 32 is connected to each of the vertical sync signal lines 12, and each of the third signal lines 33 is connected to each of the horizontal signal lines 13.

Thus, the dimming signal (DMS), the vertical sync signal (Vsync), and the horizontal sync signal (Hsync), which are generated in the control circuit board 410, are transmitted to the first sub-circuit board 310. The first sub-circuit board 310 transmits the dimming signal (DMS), the vertical sync signal (Vsync), and the horizontal sync signal (Hsync), which are received from the control circuit board 410, to the main circuit board 210. In other words, the dimming signal (DMS), the vertical sync signal (Vsync), and the horizontal sync signal (Hsync) are provided to the main circuit board 210 unchanged.

The clock signal line 14, which is electrically connected to the data input connector 313, is electrically connected to the buffer 316. The clock signal 14 extends from the buffer 316 to an opposite edge portion of the first sub-circuit board 310, and then the clock signal line 14 is electrically connected to the data output connector 311. The clock signal line 14, which is electrically connected to the data output connector 311, extends to the first connecting member 218, and is connected to the first connector 216 which is electrically connected to the three fourth signal lines 61 of the main circuit board 21.

The clock signal line 14 which is formed between the data input connector 313 and the buffer 316 may transmit the serial clock signal (SCL) generated in the control circuit. The clock signal line 14 which is formed between the buffer 316 and the data output connector 311 may transmit the amplified clock signal generated in the buffer 316.

The first connector 216 includes input terminals electrically connected to the clock signal line 14 and output terminals electrically connected to three fourth signal lines 61. The three fourth signal lines 61 are electrically connected to the first light-driving chip 213, the second light-driving chip 214, and the third light-driving chip 215 in the main circuit board 210. In other words, the amplified clock signal is divided in the first connector 216 and is provided to the first, the second, and the third light-driving chips 213, 214 and 215. According to an embodiment, the clock signal lines connected to the three fourth signal lines 61 are integrated in the clock signal line 14, thus the number of signal lines in the control circuit board 410 may be decreased.

Next, the connectivity of the power circuit board 610 of the power supply unit 600, the first sub-circuit board 310 of the buffer unit 300, and the main circuit board 210 will be described.

The power circuit board 610 includes a driving voltage line 24 which transmits the driving power signal, the first power signal, the ground voltage, a first voltage supply line 21, and ground voltage lines 22 and 23.

The driving voltage line 24 and the ground voltage lines 22 and 23 are electrically connected to the main circuit board 210. The driving voltage line 24 transmits the driving voltage generated in the power circuit board 610 to the first, the second, and the third light-driving chips 213, 214 and 215 of the main circuit board 210. The driving voltage line 24 is electrically connected to the second connecting member 219 through the power output connector 312 and a power line 72 of the main circuit board 210.

A first ground voltage line 22 of the ground voltage lines 22 and 23 is electrically connected to the first connecting member 218 through the data output connector 311 and a digital ground voltage line 73 of the main circuit board 210. A second ground voltage line 23 of the ground voltage lines 22 and 23 is connected to the second connecting member 219 through the power output connector 312 and an analog ground voltage line 71 of the main circuit board 210.

The first voltage supply line 21 transmits a first power signal generated in the power circuit board 610 to the first sub-circuit board 310. The first voltage supply line 21 is connected to the regulator 315, and the regulator 315 transforms the first power signal into a second power signal and outputs the second power signal. The first voltage supply line 21 is electrically connected to a select signal line 41 and a second voltage supply line 42. The select signal line 41, which is electrically connected with the regulator 315 and the buffer 316, transmits the chip select signal (CS), and the second voltage supply line 42 transmits the second power signal.

The select signal line 41 and the second voltage supply line 42 are electrically connected to the buffer 316 and extend to the first connecting member 218 through the data output connector 311. The select signal line 41 and the second voltage line 42 on the first connecting member 218 are electrically connected to three fifth signal lines 62 and three sixth signal lines 63 of the main circuit board 210 through the first connector 216. The select signal line 41 and the second voltage supply line 42, which is electrically connected with the buffer 316, the data output connector 311, and the first connector 216, transmits the amplified select signal and the amplified power signal.

Each of three fifth signal lines 62 is connected to the first, the second, and the third light-driving chips 213, 214 and 215, and each of three sixth signal lines 63 is connected to the first, the second and the third light-driving chips 213, 214 and 215. The first connector 216 further includes input terminals electrically connected to the select signal line 41 and the second voltage supply line 42, and output terminals electrically connected to the three fifth signal lines 62 and the three sixth signal lines 63. The amplified select signal is provided to the first, the second, and the third light-driving chips 213, 214 and 215 through the first connector 216.

According to an embodiment, the clock signal line which is electrically connected to the three fifth signal lines 62 are integrated in the clock signal line 41, and the voltage supply lines connected to the three sixth signal lines 63 are integrated in the second voltage supply line 42. Thus, the number of signal lines in the control circuit board 410 and the first sub-circuit board 310 may be decreased. Moreover, the first sub-circuit board 310 generates the second power signal using the first power signal generated in the power-generating part of the power supply unit 600. Thus it has been observed that loads in the control circuit board may be decreased, and that the control circuit board 410 and the control circuit have improved electrical stability.

In an embodiment, the data output connector 311 may include a plurality of input terminals and a plurality of output terminals which are electrically connected to the three dimming signal lines 11, the three vertical sync lines 12, the three horizontal sync lines 13, the clock signal line 14, the first ground voltage line 22, the select signal line 41 and the second voltage supply line 42. In an embodiment, the data output connector 311 may include thirteen input terminals and thirteen output terminals, connected to the three dimming signal lines 11, the three vertical sync lines 12, the three horizontal sync lines 13, the clock signal line 14, the first ground voltage line 22, the select signal line 41, and the second voltage supply line 42.

Shown in FIG. 5 is the connectivity of the main circuit board 210, the first sub-circuit board 310, the control unit 400, and the power supply unit 600, and the connectivity of the rest of the main circuit boards 220, 230, 240, 250, 260, 270 and 280, and the first sub-circuit board 310, or the second circuit board 320, are substantially the same as the connectivity of the main circuit board 210, the first sub-circuit board 310, the control unit 400 and the power supply unit 600. Thus, any further description will be omitted.

The data input connector 313 can further include a plurality of second input/output ("I/O") terminals, a plurality of third I/O terminals, and a plurality of fourth I/O terminals with the first I/O terminals. In an embodiment, the data input connector 313 further include ten second input/output I/O terminals, ten third I/O terminals, and ten fourth I/O terminals with ten first I/O terminals. The second, the third, and the fourth I/O terminals are connected to the rest of the main circuit boards 220, 230 and 240. Thus, the data input connector 313 may include at least forty I/O terminals in total. The number of the I/O terminals depends on the number of the main circuit boards connected to the first sub-circuit board.

Hereinafter, a backlight assembly in accordance with Embodiment 2, and a display apparatus having the backlight assembly, will be described with reference to FIGS. 6 and 7.

Figure 6:
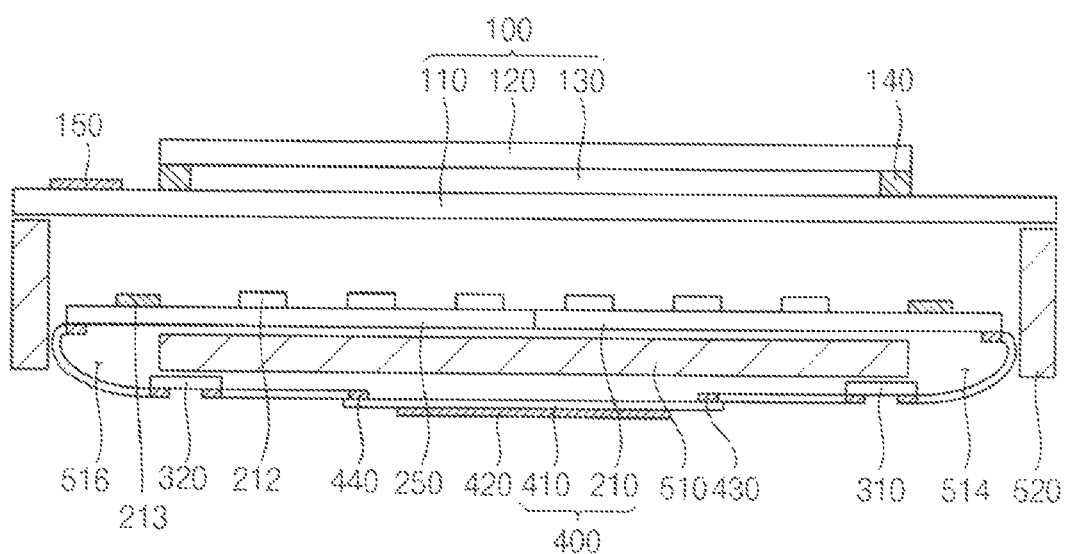
FIG. 6 is a cross-sectional view showing an exemplary embodiment of a display apparatus in accordance with Embodiment 2.
Figure 7:
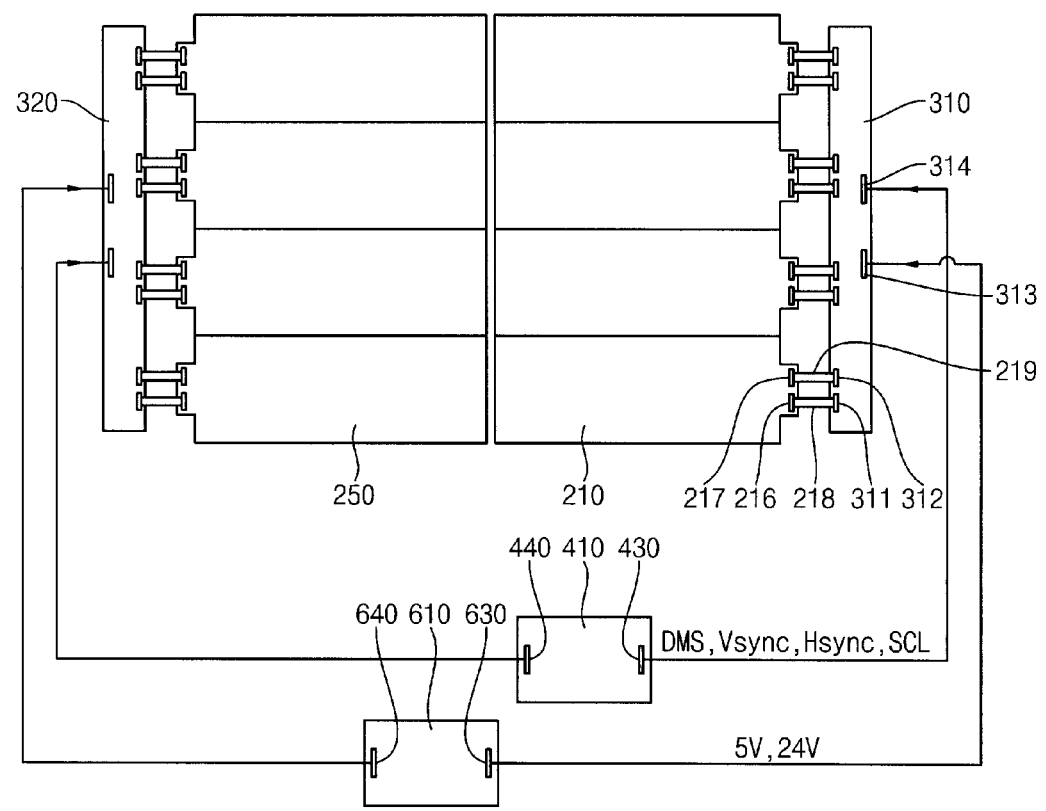
FIG. 7 is a rear view showing an exemplary embodiment of the backlight assembly shown in FIG. 6.

FIG. 6 is a cross-sectional view illustrating an exemplary embodiment of a display apparatus in accordance with Embodiment 2, and FIG. 7 is a rear view showing an exemplary embodiment of the backlight assembly shown in FIG. 6.

In FIGS. 6 and 7, a backlight assembly and a display apparatus having the same, in accordance with Embodiment 2, is substantially the same as the backlight assembly in accordance with Embodiment 1, and the display apparatus having the backlight assembly previously described above, except for the arrangement of a plurality of main circuit boards, a first sub-circuit board, and a second sub-circuit board, and the structure of a bottom face in a container. Thus, any further description will be omitted.

Referring to FIGS. 6 and 7, in Embodiment 2 a first sub-circuit board 310 and a second sub-circuit 320 board are disposed at opposite sides of a display panel 100. A portion of main circuit boards 210, 220, 230 and 240 are electrically connected to the first sub-circuit board 310, and are disposed opposite to a portion of main circuit boards 250, 260, 270 and 280, which are electrically connected to the second sub-circuit board 320. Thus main circuit boards 210, 220, 230 and 240 and first sub-circuit board 310 can be configured as a mirror image of main circuit boards 250, 260, 270 and 280 and the second sub-circuit board 320. The first main circuit boards are main circuit boards 210, 220, 230 and 240, which are electrically connected to the first sub-circuit board 310, and the second main circuit boards are the main circuit boards 250, 260, 270 and 280, which are electrically connected to the second sub-circuit board 320. The first sub-circuit board 310 and the second sub-circuit board 320 are disposed at a side of the first main circuit board and at a side of the second main circuit board. A bottom face 510 of a container 500 includes a second opening 514 and a third opening 516 disposed on either side of the bottom face 510. The first sub-circuit board 310 can de disposed in the second opening 514 and thus can be disposed on a rear face of the bottom face 510. The second sub-circuit board 320 can be disposed in the third opening 516 and thus can be disposed on the rear face of the bottom face 510.

By using the first sub-circuit board 310 and the second sub-circuit board 320, the number of signal lines in the control circuit board 410 may be decreased, and the configuration of the main circuit board, such as the first main circuit boards 210, 220, 230 and 240, and the second main circuit boards 250, 260, 270 and 280, and the display panel 100, may changed as desired when configuring the display apparatus.

Figure 8:
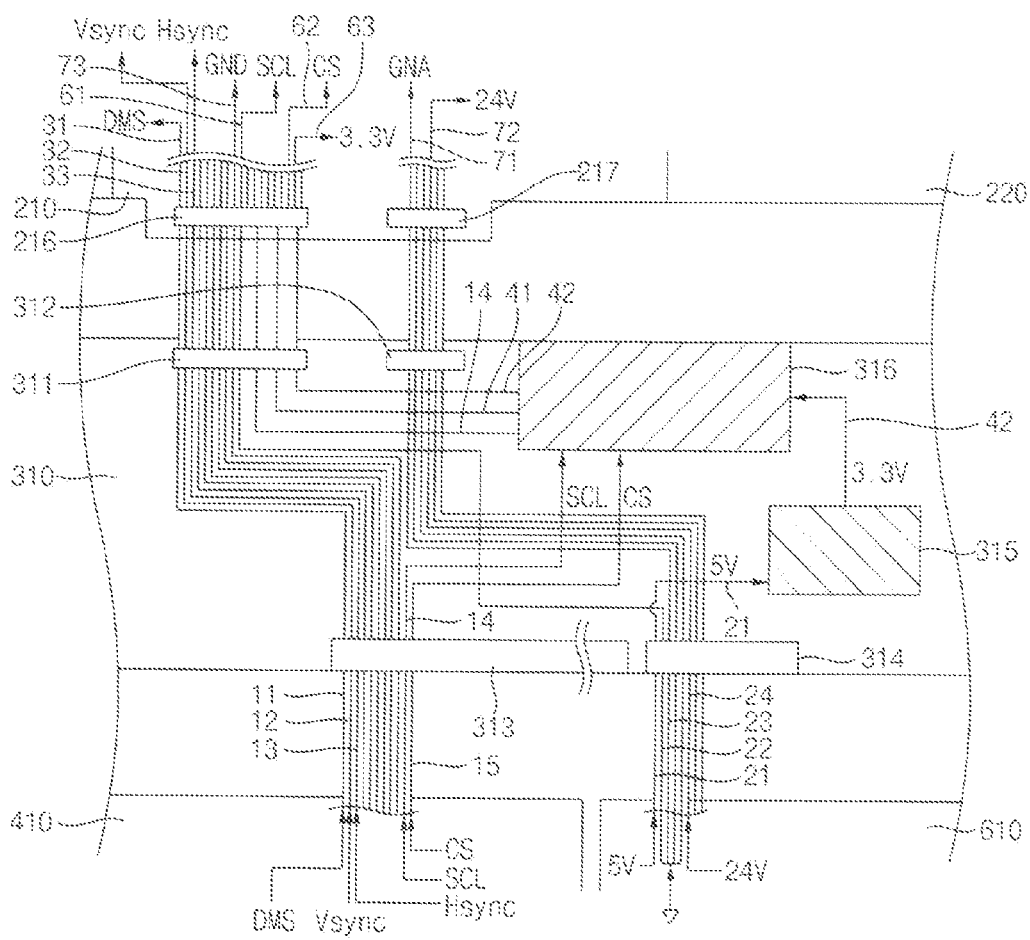
FIG. 8 is a schematic circuit view showing an exemplary embodiment of a buffer unit in accordance with Embodiment 3.

FIG. 8 is a schematic circuit view showing an exemplary embodiment of a buffer unit in accordance with Embodiment 3.

In FIG. 8, the schematic circuit view of a buffer unit in accordance with Embodiment 3 is substantially the same as the schematic circuit view in accordance with Embodiment 1, except for a select signal line. Thus, any further description will be omitted.

Referring to FIG. 8, a control circuit board 410 includes a select signal line 15. A control circuit part generates a chip select signal (CS), and the chip select signal (CS) is transmitted through the select signal line 15.

The select signal line 15 is connected to a main circuit board 210 and transmits the chip select signal (CS) to the main circuit board 210. The select signal line 15 is electrically connected to a first sub-circuit board 310 through a data input connector 313, and the select signal line 15 extending in the first sub-circuit board 310 is electrically connected to a buffer 316. The data input connector 313 may further include a fifth I/O terminal which is electrically connected to the select signal line 15.

The select signal line 15, which is electrically connected to the control circuit board 410 and the buffer 316, transmits the chip select signal (CS). A chip select signal is amplified into an amplified select signal in the buffer 316, and the amplified select signal is transmitted to the select signal line 15 which is electrically connected to the buffer 316, the data output connector 311, and a first connector 216.

The data input connector 313 may further include four fifth I/O terminals with forty I/O terminals in total, as is illustrated in FIG. 5. Thus the data input connector 313 may include forty four I/O terminals in total. The minimum number of essential I/O terminals may depend on the number of the main circuit boards connected to the first sub-circuit board 310.

According to the embodiments, a control circuit board and a main circuit board are electrically connected by a sub-circuit board, and the sub-circuit board amplifies a control signal received from the control circuit board and outputs the control signal to the main circuit board. Thus, it has been observed that the number of signal lines in the control circuit board, which is electrically connected to the main circuit board, may be decreased and loads in the control circuit board may be decreased, and thus the control circuit board has improved electrical stability.

The foregoing disclosure is illustrative and is not to be construed as limiting thereof. Although a few embodiments have been described, those skilled in the art will readily appreciate that many modifications are possible in the embodiments without materially departing from the novel teachings and advantages of this disclosure. Accordingly, all such modifications are intended to be included within the scope of the disclosure as defined in the claims. Therefore, it is to be understood that the foregoing is illustrative of the disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A backlight assembly, comprising:
    a main circuit board comprising a light-generating part;
    a control circuit board which provides a control signal to control the light-generating part; and
    a sub-circuit board which is electrically connected to the control circuit board and receives the control signal, wherein the sub-circuit board
        receives a power signal and generates an amplified power signal in response to the power signal,
        includes a buffer which generates an amplified control signal in response to the control signal, and
        is electrically connected to the main circuit board, and provides the amplified control signal and the amplified power signal to the main circuit board.

2. The backlight assembly of claim 1, wherein the light-generating part comprises:
    a light source; and
    a light-driving chip which drives the light source.

3. The backlight assembly of claim 2,
    wherein the main circuit board includes a first connector electrically connected to the buffer, the first connector dividing the amplified control signal to form a plurality of divided amplified control signals, and
    wherein each of the divided amplified control signals is provided to the light-driving chip.

4. The backlight assembly of claim 2, wherein
    the light source includes a red diode, a green diode and a blue diode, and
    the light-driving chip includes:
        a first light-driving chip electrically connected to the red diode,
        a second light-driving chip electrically connected to the green diode, and
        a third light-driving chip electrically connected to the blue diode.

5. The backlight assembly of claim 1, further comprising a power circuit board electrically connected to the sub-circuit board, wherein the power circuit board includes a power-generating part which provides the power signal to the sub-circuit board.

6. The backlight assembly of claim 5,
wherein the sub-circuit board further comprises a regulator electrically connected to the power circuit board and receiving the power signal from the power circuit board, the regulator transforming the power signal to a second power signal and providing the second power signal to the buffer, and
wherein the buffer generates the amplified power signal in response to the second power signal received from the regulator.

7. The backlight assembly of claim 6,
wherein the main circuit board includes a first connector electrically connected to the sub-circuit board, the first connector dividing each of the amplified control signal and the amplified power signal to form a plurality of divided amplified control signals and a plurality of divided amplified power signals, and
wherein each of the divided amplified control signals and each of the divided amplified power signals are provided to each of a plurality of light-driving chips.

8. The backlight assembly of claim 7, wherein the sub-circuit board includes a data output connector electrically connected to the first connector by a first connecting member, the data output connector receiving the amplified power signal and the amplified control signal from the buffer and providing the amplified power signal and the amplified control signal to the main circuit board.

9. The backlight assembly of claim 5, wherein the sub-circuit board includes a power input connector electrically connected to the power circuit board, the power input connector receiving the power signal.

10. The backlight assembly of claim 9, wherein the power-generating part generates a driving voltage which drives a light-driving chip, and the power input connector receives the power signal and the driving voltage.

11. The backlight assembly of claim 10, wherein the sub-circuit board includes a power output connector electrically connected to the main circuit board which provides the driving voltage.

12. The backlight assembly of claim 11, wherein the main circuit board includes a second connector electrically connected to the power output connector by a second connecting member, the second connector providing the driving voltage to the light-driving chip, wherein the driving voltage is unchanged, the driving voltage passing from the sub-circuit board to the power output connector.

13. The backlight assembly of claim 5, wherein the sub-circuit board includes a data input connector electrically connected to the control circuit board which receives the control signal.

14. The backlight assembly of claim 13, wherein the control circuit board generates a data signal which drives light-driving chips of the light-generating part, and the data input connector receives the data signals.

15. A display apparatus, comprising:
a display panel which displays an image using light; and
a backlight assembly disposed under the display panel which provides the light,
wherein the backlight assembly includes:
a main circuit board comprising a light-generating part;
a control circuit board which provides a control signal which controls the light-generating part; and
a sub-circuit board which is electrically connected to the control circuit board and receives the control signal, wherein the sub-circuit board
receives a power signal and generates an amplified power signal in response to the power signal,
includes a buffer which generates an amplified control signal in response to the control signal, and
is electrically connected to the main circuit board, and provides the amplified control signal and the amplified power signal to the main circuit board.

16. The display apparatus of claim 15, wherein the light-generating part comprises:
a light source; and
a light-driving chip which drives the light source.

17. The display apparatus of claim 15, further comprising a power circuit board including a power-generating part which provides the power signal to the sub-circuit board, the power circuit board electrically connected the sub-circuit board.

18. The display apparatus of claim 17,
wherein the sub-circuit board further comprises a regulator which is electrically connected to the power circuit board and receives the power signal from the power circuit board, transforms the power signal to a second power signal, and provides the second power signal to the buffer,
and wherein the buffer generates the amplified power signal in response to the second power signal received from the regulator.

19. The display apparatus of claim 18, wherein the sub-circuit board includes:
a data input connector which is electrically connected to the control circuit board and receives the control signal from the control circuit board; and
a data output connector which is electrically connected to the main circuit board and provides the amplified control signal to the main circuit board.

20. The display apparatus of claim 18, wherein the sub-circuit board includes:
a power input connector which is electrically connected to the power circuit board and receives the power signal from the power circuit board; and
a power output connector which is electrically connected to the main circuit board and provides a driving voltage generated in the power circuit board to the main circuit board, the driving voltage driving a plurality of light-driving chips.

* * * * *